United States Patent
Philipp et al.

(10) Patent No.: US 7,929,336 B2
(45) Date of Patent: Apr. 19, 2011

(54) INTEGRATED CIRCUIT INCLUDING A MEMORY ELEMENT PROGRAMMED USING A SEED PULSE

(75) Inventors: Jan Boris Philipp, Munich (DE); Thomas Happ, Dresden (DE); Bernhard Ruf, Sauerlach (DE); Christian Rüster, Augsburg (DE)

(73) Assignee: Qimonda AG, Munich (DE)

( * ) Notice: Subject to any disclaimer, the term of this patent is extended or adjusted under 35 U.S.C. 154(b) by 189 days.

(21) Appl. No.: 12/137,096

(22) Filed: Jun. 11, 2008

(65) Prior Publication Data
US 2009/0310401 A1   Dec. 17, 2009

(51) Int. Cl.
*G11C 11/00* (2006.01)
(52) U.S. Cl. .................... 365/163; 365/148; 365/158
(58) Field of Classification Search .............. 365/163, 365/148, 158, 185.18–185.19; 257/2–5
See application file for complete search history.

(56) References Cited

U.S. PATENT DOCUMENTS

| | | | |
|---|---|---|---|
| 6,570,784 B2 | 5/2003 | Lowrey | |
| 6,687,153 B2 | 2/2004 | Lowrey | |
| 6,967,865 B2* | 11/2005 | Lee | 365/163 |
| 7,020,014 B2* | 3/2006 | Khouri et al. | 365/163 |
| 7,031,181 B1 | 4/2006 | Happ | |
| 7,110,286 B2 | 9/2006 | Choi et al. | |
| 7,436,693 B2* | 10/2008 | Kang et al. | 365/148 |
| 7,606,064 B2* | 10/2009 | Jeong et al. | 365/163 |
| 7,688,621 B2* | 3/2010 | Cho et al. | 365/163 |
| 7,787,291 B2* | 8/2010 | Resta et al. | 365/163 |
| 2008/0062751 A1 | 3/2008 | Park et al. | |

OTHER PUBLICATIONS

"Highly reliable 50nm Contact Cell Technology for 256Mb PRAM", S. J. Ahn, et al., Samsung Electronics Co., Ltd (2 pgs.).
"OUM—A 180 nm Nonvolatile Memory Cell Element Technology for Stand Alone and Embedded Applications", Stefan Lai, et al., Intel Corporation (4 pgs.).
"Ovonic Unified Memory—A High-performance Nonvolatile memory Technology for Stand Alone Memory and Embedded Applications", Manzur Gill, et al., Intel Corporation (4 pgs.).

* cited by examiner

*Primary Examiner* — David Lam
(74) *Attorney, Agent, or Firm* — Dicke, Billig & Czaja, PLLC

(57) ABSTRACT

An integrated circuit includes a resistance changing memory element and a circuit. The circuit is configured to program the memory element to a crystalline state from an amorphous state by applying a seed pulse to the memory element followed by a set pulse.

16 Claims, 7 Drawing Sheets

INTEGRATED CIRCUIT INCLUDING A MEMORY ELEMENT PROGRAMMED USING A SEED PULSE

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state—"set"—and from the crystalline state to the amorphous state—"reset"—in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The critical dimensions of memory cells within an array may vary due to the processes used to fabricate the memory cells. The variations of the critical dimensions may cause fluctuations of the current used to reset the memory cells to the amorphous state. In an array of memory cells, the memory cell with the largest reset current typically determines the reset pulse. Thus, memory cells having a smaller reset current may be over reset in response to the reset pulse. To compensate for the over reset, the time for setting the memory cell to the crystalline state is typically increased. By increasing the time for setting the memory cell to the crystalline state, the overall speed of the phase change memory is reduced.

For these and other reasons, there is a need for the present invention.

SUMMARY

One embodiment provides an integrated circuit. The integrated circuit includes a resistance changing memory element and a circuit. The circuit is configured to program the memory element to a crystalline state from an amorphous state by applying a seed pulse to the memory element followed by a set pulse.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
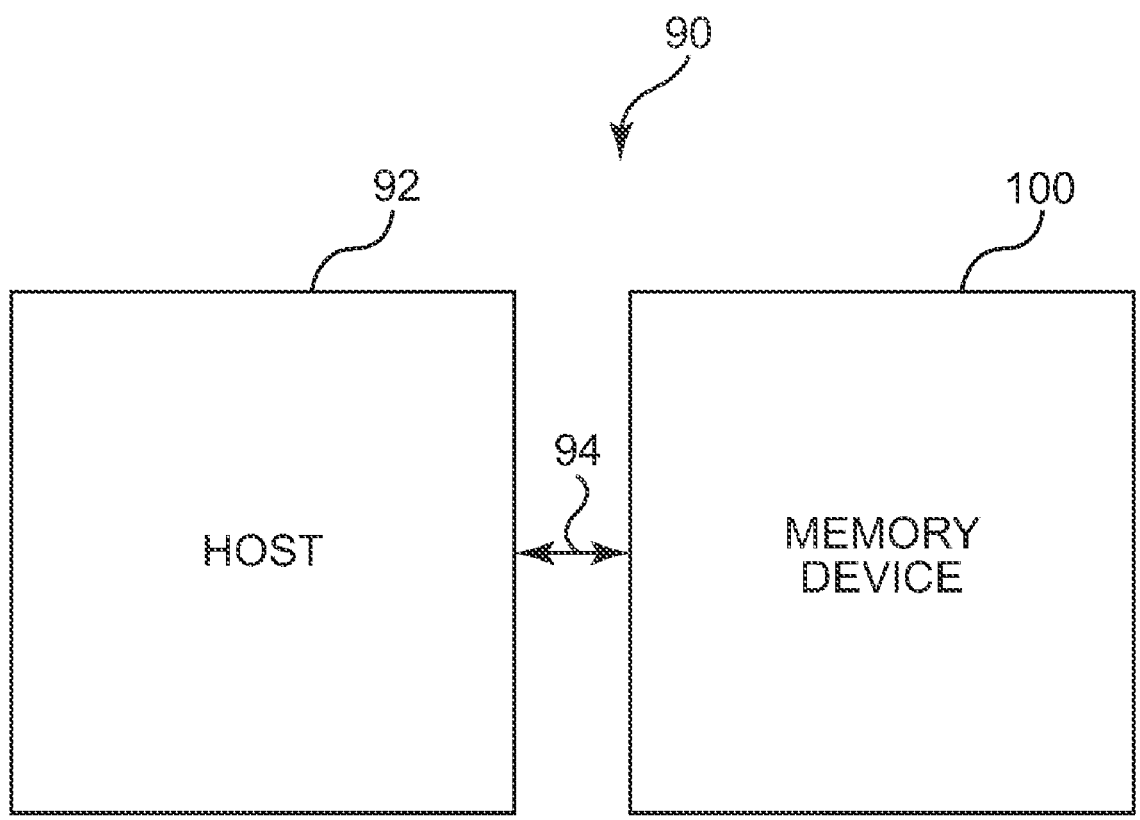
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a microprocessor, computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or another suitable resistive or resistivity changing material memory device.

Figure 2:
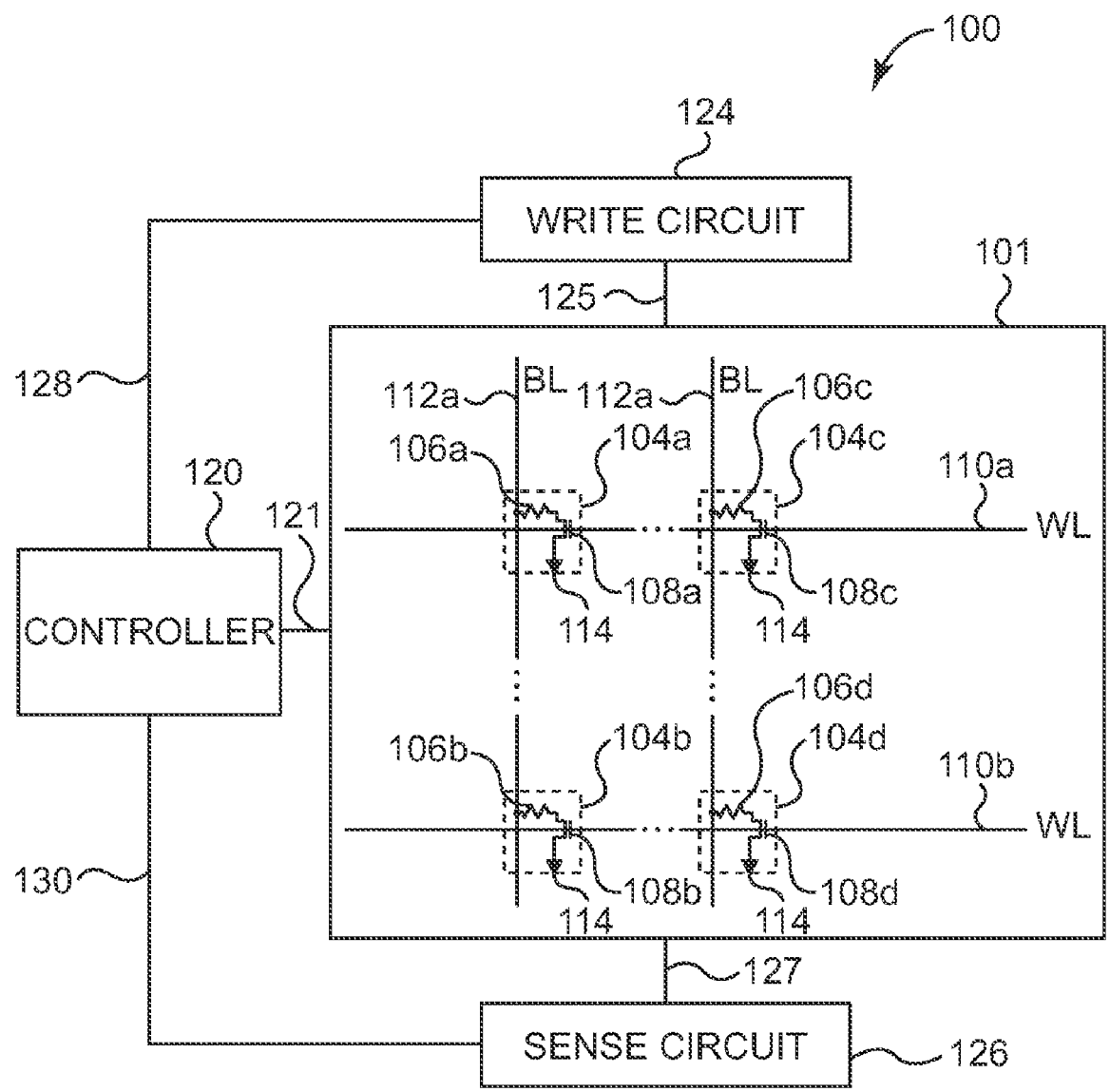
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes a write circuit 124, a controller 120, a memory array 101, and a sense circuit 126. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

In one embodiment, a memory cell 104 is set to the crystalline state by applying a seed pulse followed by a set pulse or by applying a seed-set pulse to the memory cell 104. The seed pulse or the seed portion of the seed-set pulse compensates for an over reset memory cell 104 by reducing the volume of amorphous phase change material in the memory cell. In addition, the seed pulse or the seed portion of the seed-set pulse increases the number of nucleation sites within an over reset memory cell 104. Following the seed pulse or the seed portion of the seed-set pulse, the set pulse or the set portion of the seed-set pulse programs the memory cell 104 to the crystalline state. The seed pulse and set pulse combination or the seed-set pulse program the memory cell 104 to the crystalline state without substantially increasing the length of the set pulse to compensate for an over reset memory cell.

As used herein, the term "electrically coupled" is not meant to mean that the elements must be directly coupled together and intervening elements may be provided between the "electrically coupled" elements.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130. Each phase change memory cell 104 is electrically coupled to a word line 110, a bit line 112, and a common or ground 114. Phase change memory cell 104a is electrically coupled to bit line 112a, word line 110a, and common or ground 114. Phase change memory cell 104b is electrically coupled to bit line 112a, word line 110b, and common or ground 114. Phase change memory cell 104c is electrically coupled to bit line 112b, word line 110a, and common or ground 114. Phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode or diode-like structure is used in place of transistor 108. In this case, a diode and phase change element 106 is coupled in series between each cross point of word lines 110 and bit lines 112.

Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

In one embodiment, each phase change element 106 includes a phase change material that may be made up of a variety of materials. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe, or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100. In the amorphous state, a phase change material exhibits significantly higher resistivity than in the crystalline state. Therefore, the two or more states of phase change elements 106a-106d differ in their electrical resistivity.

In one embodiment, the two or more states are two states and a binary system is used, wherein the two states are assigned bit values of "0" and "1". In another embodiment, the two or more states are three states and a ternary system is used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a reset operation of phase change memory cell 104a, word line 110a is selected to activate transistor 108a. With word line 110a selected, a reset current or voltage pulse is selectively enabled by write circuit 124 and sent through bit line 112a to phase change element 106a. The reset current or voltage quickly heats phase change element 106a above its melting temperature. After the current or voltage pulse is turned off, phase change element 106a quickly quench cools into the amorphous state or a partially amorphous and partially crystalline state.

During a set operation of phase change memory cell 104a, word line 110a is selected to activate transistor 108a. With word line 110a selected, a seed pulse including a current or voltage pulse is selectively enabled by write circuit 124 and sent through bit line 112a to phase change element 106a. In one embodiment, the seed pulse is a borderline reset pulse that compensates for an over reset of phase change element 106a. The seed pulse reduces the volume of amorphous phase change material in phase change element 106a and increases the number of nucleation sites in phase change element 106a.

Following the seed pulse and an optional delay, one or more set current or voltage pulses are selectively enabled by write circuit 124 and sent through bit line 112a to phase change element 106a. The set current or voltage pulses heat phase change element 106a above its crystallization temperature (but usually below its melting temperature). In this way, phase change element 106a reaches the crystalline state or a partially crystalline and partially amorphous state during this set operation. Phase change memory cells 104b-104d and other phase change memory cells 104 in memory array 101 are set and reset similarly to phase change memory cell 104a using similar current or voltage pulses.

Figure 3:
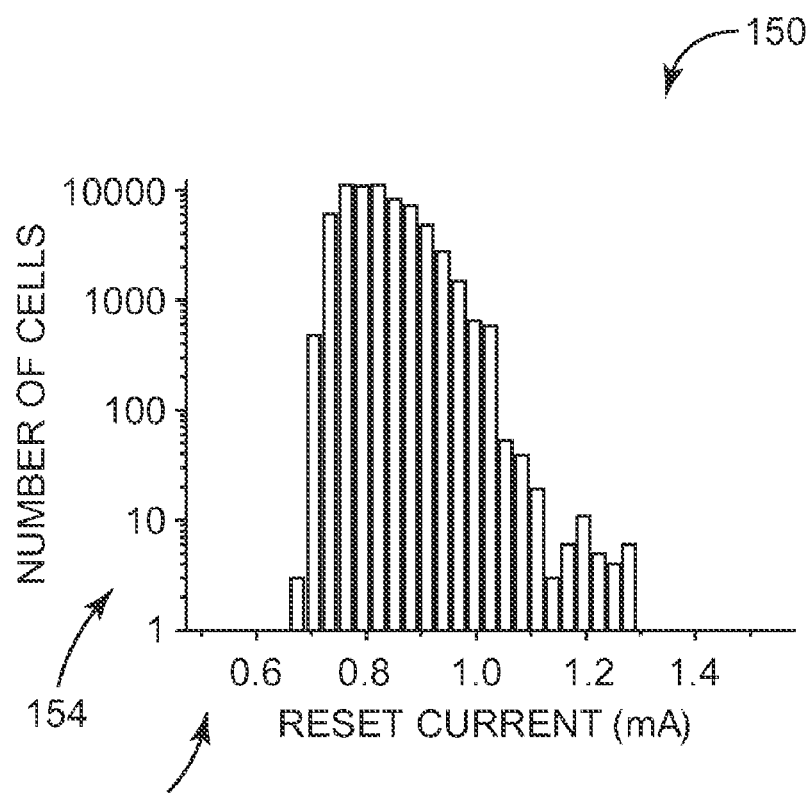
FIG. 3 is a chart illustrating one embodiment of a reset current distribution for an array of phase change memory cells.

FIG. 3 is a chart 150 illustrating one embodiment of a reset current distribution for an array of phase change memory cells, such as memory array 101. In this embodiment, the reference resistance is 400 kOhm. Chart 150 includes the reset current in milliamps (mA) on x-axis 152 and the number of cells on y-axis 154. Each bar in chart 150 indicates the number of memory cells reset to a resistance greater than the reference resistance using a reset pulse having the indicated current.

For memory cells reset using a reset pulse having a lower pulse amplitude, such as between 0.65 mA-0.8 mA, a reset pulse having a higher pulse amplitude, such as 1.0 mA may result in the memory cells being over reset. For example in one embodiment, if a reset pulse having a 1.0 mA pulse amplitude is applied to a memory cell reset by a reset pulse having a pulse amplitude of 0.8 mA, the memory cell may be over reset by 20%. Likewise, if a reset pulse having a 1.1 mA pulse amplitude is applied to a memory cell reset by a reset pulse having a pulse amplitude of 1.0 mA, the memory cell may be over reset by 10%.

Figure 4:
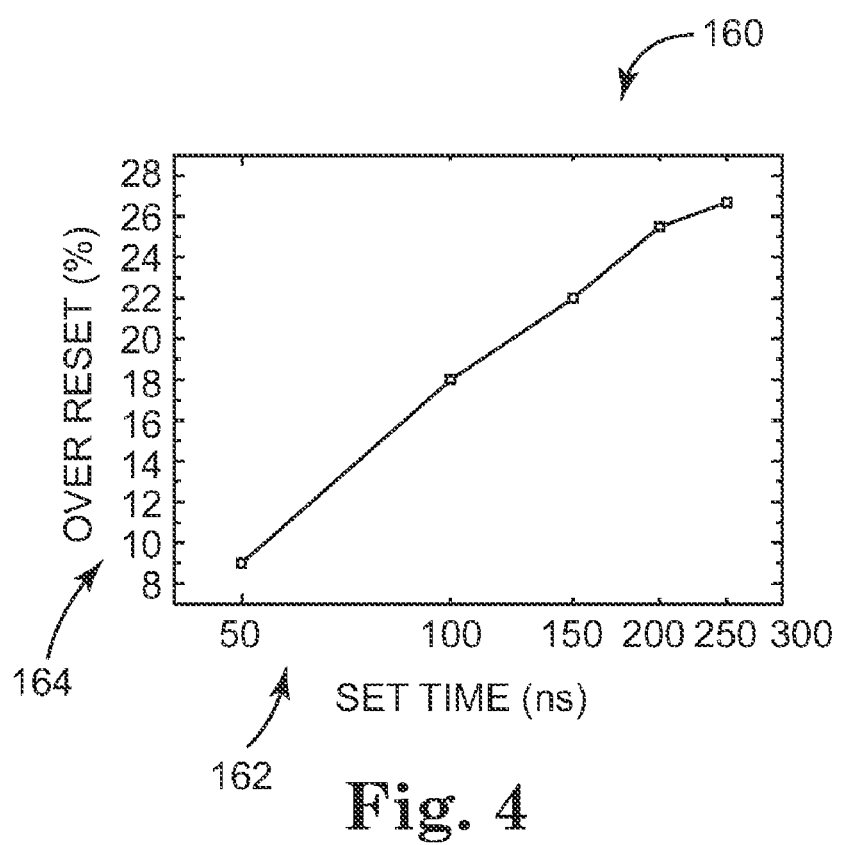
FIG. 4 is a chart illustrating one embodiment of the set times for setting over reset phase change memory cells without using a seed pulse.

FIG. 4 is a chart 160 illustrating one embodiment of the set times for setting over reset phase change memory cells without using a seed pulse. Chart 160 includes the set time in nanoseconds (ns) on x-axis 162 and the over reset percentage on y-axis 164. As indicated by chart 160, as the over reset percentage of a phase change memory cell increases, the set time increases to compensate for the over reset. For example in one embodiment, for a phase change memory cell over reset by approximately 22%, the set time is approximately 150 ns. Likewise, for a phase change memory cell over reset by approximately 27%, the set time is approximately 250 ns. Increasing the set time reduces the overall speed of the phase change memory.

Figure 5:
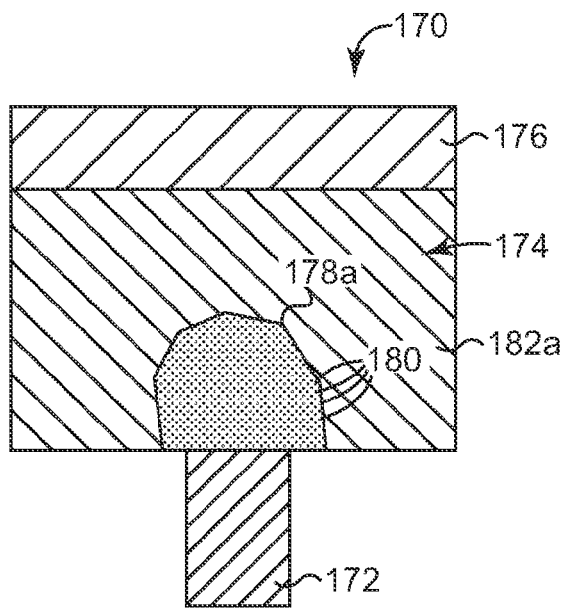
FIG. 5 illustrates a cross-sectional view of one embodiment of a phase change element in a reset state.

FIG. 5 illustrates a cross-sectional view of one embodiment of a phase change element 170 in a reset state. In one embodiment, phase change element 170 provides phase change elements 106a-106d previously described and illustrated with reference to FIG. 1. Phase change element 170 includes a first electrode 172, phase change material 174, and a second electrode 176.

The top of first electrode 172 contacts the bottom of phase change material 174. First electrode 172 includes TiN, TaN, W, Al, Ti, Ta, TiSiN, TaSiN, TiAlN, TaAlN, WN, C, Cu, or other suitable electrode material. In one embodiment, the cross-sectional width of first electrode 172 is less than the cross-sectional width of phase change material 174. The top of phase change material 174 contacts the bottom of second electrode 176. Second electrode 176 includes TiN, TaN, W, Al, Ti, Ta, TiSiN, TaSiN, TiAlN, TaAlN, WN, C, Cu, or other suitable electrode material. In one embodiment, the cross-sectional width of phase change material 174 is equal to the cross-sectional width of second electrode 176. In one embodiment, dielectric material (not shown) laterally surrounds first electrode 172, phase change material 174, and second electrode 176. In other embodiments, phase change element 170 has other suitable configurations.

Phase change material 174 is programmed to the reset state. In the reset state, phase change material 174 includes crystalline phase change material as indicated at 182a and amorphous phase change material as indicated at 178a. The amorphous phase change material at 178a includes nucleation sites 180. Nucleation sites 180 support the transition of amorphous phase change material to crystalline phase change material during a set operation.

Figure 6:
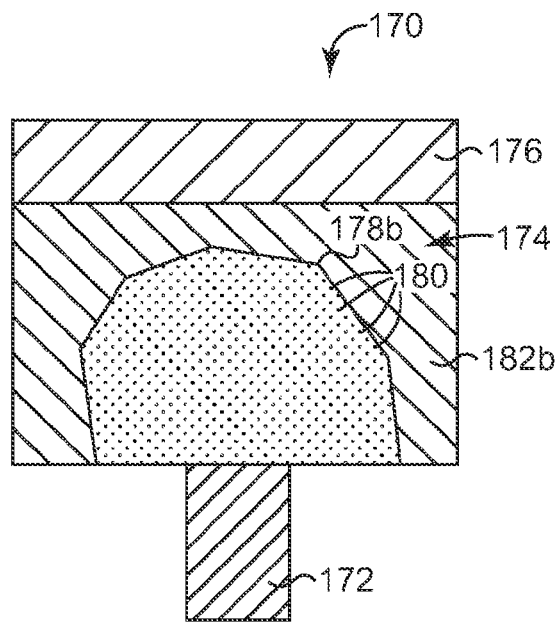
FIG. 6 illustrates a cross-sectional view of one embodiment of a phase change element in an over reset state.

FIG. 6 illustrates a cross-sectional view of one embodiment of phase change element 170 in an over reset state. Phase change material 174 is programmed to an over reset state. In the over reset state, phase change material 174 includes crystalline phase material as indicated at 182b and amorphous phase change material as indicated at 178b.

The volume of amorphous phase change material at 178b is greater than the volume of amorphous phase change material at 178a previously described and illustrated with reference to FIG. 5. In addition, the density of nucleation sites 180 within the amorphous phase change material at 178b is less than the density of nucleation sites within the amorphous phase change material at 178a previously described and illustrated with reference to FIG. 5. The increase in the volume of amorphous phase change material and the decrease in the density of nucleation sites within the amorphous phase change material increase the set time for programming phase change element 170 to the crystalline state if a seed pulse is not used.

Figure 7:
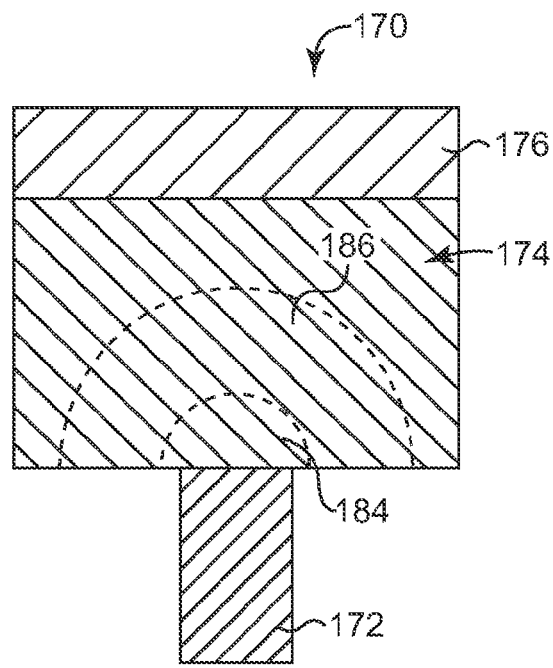
FIG. 7 illustrates a cross-sectional view of one embodiment of a phase change element highlighting portions of the memory element that are affected by a seed pulse.

FIG. 7 illustrates a cross-sectional view of one embodiment of phase change element 170 highlighting portions of the memory element that are affected by a seed pulse. A seed pulse is applied to phase change element 170 before a set pulse to compensate for an over reset phase change element. In one embodiment, the seed pulse is a borderline reset pulse having a pulse amplitude less than a reset pulse but greater than a set pulse. The Joule heating resulting from the seed pulse creates a temperature gradient in the phase change element. The zone with the highest temperature is located close to first electrode 172. The seed pulse heats the phase change material within the zone indicated at 184 to temperatures close to or above the melting temperature of the phase change material. These temperatures are not effective for setting the phase change material at 184 to the crystalline state.

Farther away from first electrode 172, temperatures within the zone indicated at 186 are generally lower than in 184. The seed pulse heats the phase change material within the zone indicated at 186 to temperatures less than those at 184. These lower temperatures are effective for setting a portion of the phase change material at 186 to the crystalline state. Therefore, the seed pulse reduces the volume of amorphous phase change material at 186. The reduction in the volume of amorphous phase change material allows a shorter set pulse to be used following the seed pulse to set the phase change material to the crystalline state.

Figure 8:
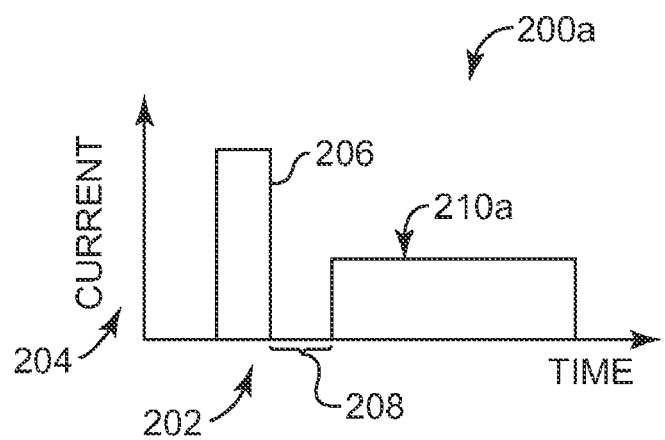
FIG. 8 is a diagram illustrating one embodiment of pulses for setting a phase change element to the crystalline state.

FIG. 8 is a diagram 200a illustrating one embodiment of pulses for setting a phase change element to the crystalline state. Diagram 200a includes time on x-axis 202 and current on y-axis 204. Diagram 200a includes a seed pulse 206 and a set pulse 210a. In one embodiment, seed pulse 206 has a pulse width within a range of approximately 10 ns-150 ns. In one embodiment, seed pulse 206 is followed by a delay 208 having a time within a range of 1 ns-15 ns before set pulse 210a. In other embodiments, delay 208 is excluded and set pulse 210a immediately follows seed pulse 206.

In one embodiment, set pulse 210a includes a constant amplitude set pulse having a pulse width within a range of approximately 40 ns-250 ns. The amplitude of set pulse 210a is less than the amplitude of seed pulse 206. Set pulse 210a heats the amorphous phase change material within the phase change element above its crystallization temperature, but below the near melting temperature induced by seed pulse 206. Seed pulse 206 reduces the volume of amorphous phase change material of an over reset phase change element and set pulse 210a programs the phase change element to the crystalline state.

Figure 9:
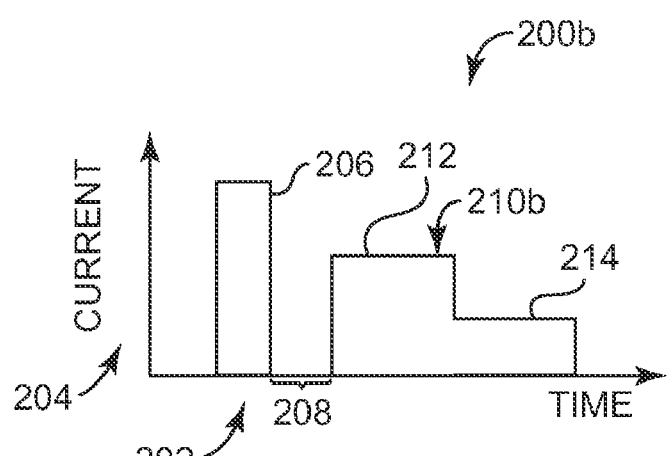
FIG. 9 is a diagram illustrating another embodiment of pulses for setting a phase element to the crystalline state.

FIG. 9 is a diagram 200b illustrating another embodiment of pulses for setting a phase change element to the crystalline state. Diagram 200b includes time on x-axis 202 and current on y-axis 204. Diagram 200b includes a seed pulse 206 and a set pulse 210b. In one embodiment, set pulse 210b includes a multi-step set pulse having a pulse width within a range of approximately 40 ns-250 ns. Set pulse 210b includes a first step 212 having a first amplitude and a second step 214 having a second amplitude less than the first amplitude. The amplitude of first step 212 is less than the amplitude of seed pulse 206. The amplitude of second step 214 is less than the amplitude of first step 212. Set pulse 210b heats the amorphous phase change material within the phase change element above its crystallization temperature, but below the near melting temperature induced by seed pulse 206. Seed pulse 206 reduces the volume of amorphous phase change material of an over reset phase change element and set pulse 210b programs the phase change element to the crystalline state.

Figure 10:
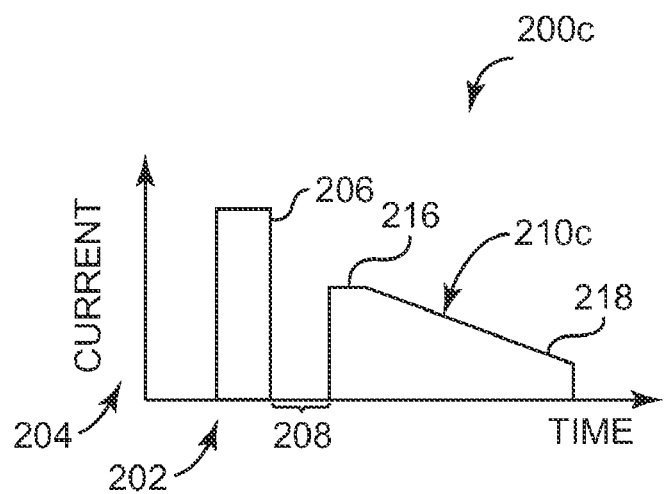
FIG. 10 is a diagram illustrating another embodiment of pulses for setting a phase change element to the crystalline state.

FIG. 10 is a diagram 200c illustrating another embodiment of pulses for setting a phase change element to the crystalline state. Diagram 200c includes time on x-axis 202 and current on y-axis 204. Diagram 200c includes a seed pulse 206 and a set pulse 210c. In one embodiment, set pulse 210c includes a ramping tail set pulse having a pulse width within a range of approximately 40 ns-250 ns. Set pulse 210c includes a step portion 216 having a constant amplitude and a ramping tail portion 218. The amplitude of step portion 216 is less than the amplitude of seed pulse 206. Set pulse 210c heats the amorphous phase change material within the phase change element above its crystallization temperature, but below the near melting temperature induced by seed pulse 206. Seed pulse 206 reduces the volume of amorphous phase change material of an over reset phase change element and set pulse 210c programs the phase change element to the crystalline state.

Figure 11:
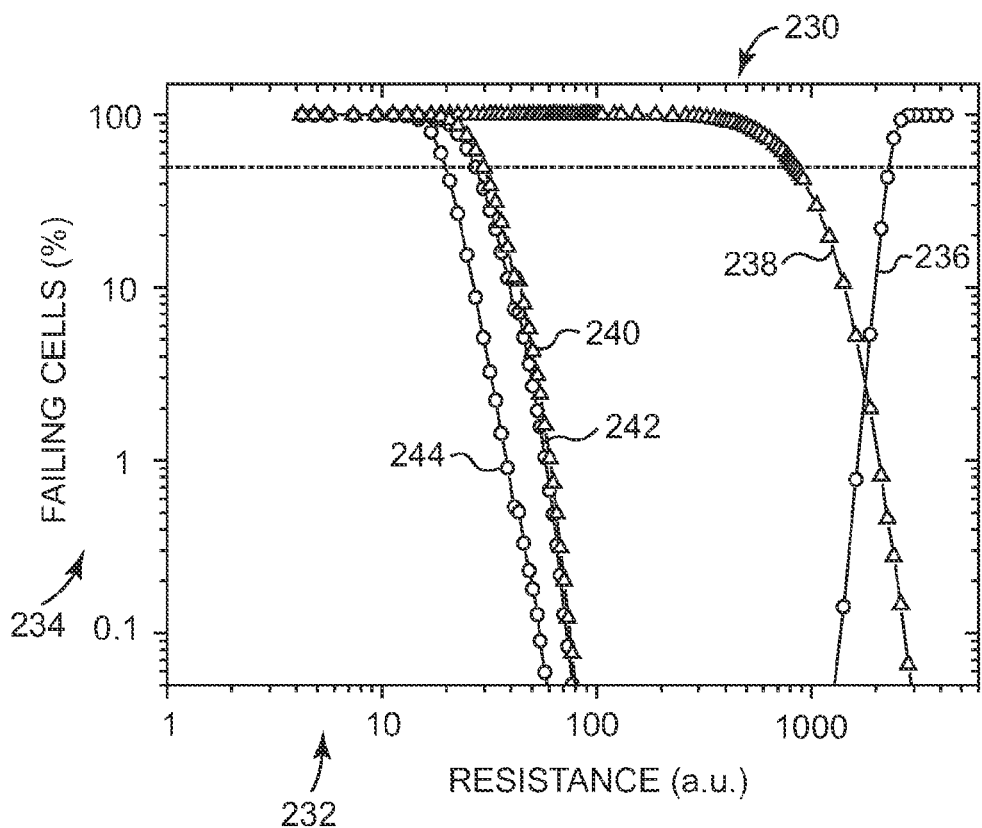
FIG. 11 is a chart illustrating one embodiment of the resistance distributions for an array of phase change memory cells for various write pulses.

FIG. 11 is a chart 230 illustrating one embodiment of the resistance distributions for an array of phase change memory cells for various write pulses. Chart 230 includes resistance in arbitrary unit (a.u.) on x-axis 232 and failing cells as a percentage on y-axis 234. Curve 236 indicates the resistance distribution for an array of memory cells after a reset pulse is applied to each memory cell. Curve 238 indicates the resistance distribution for an array of memory cells after a seed pulse is applied to each memory cell. In this embodiment, the pulse width of the seed pulse is 50 ns. As indicated by curve 238, a seed pulse is not effective for setting a memory cell to the crystalline state. The seed pulse compensates for over reset memory cells and slightly reduces the resistance distribution compared to the reset resistance distribution indicated by curve 236.

Curve 240 indicates the resistance distribution for an array of memory cells after a set pulse, without a seed pulse, is applied to each memory cell. In this embodiment, the pulse width of the set pulse is 250 ns. Curve 242 indicates another resistance distribution for an array of memory cells after a set pulse, without a seed pulse, is applied to each memory cell. In this embodiment, the pulse width of the set pulse is 310 ns. As indicated by curves 240 and 242, the 60 ns increase in the pulse width of the set pulse does not significantly reduce the resistance distribution.

Curve 244 indicates the resistance distribution for an array of memory cells after a seed pulse followed by a set pulse is applied to each memory cell. In this embodiment, the pulse width of the seed pulse is 50 ns and the pulse width of the set pulse is 250 ns. There is a delay of 10 ns between the seed pulse and the set pulse such that the total programming time to set each memory cell to the crystalline state is 310 ns. As indicated by curve 244, the seed pulse followed by the set pulse significantly reduces the resistance distribution compared to the resistance distribution provided by a set pulse alone as indicated by curves 240 and 242.

Figure 12:
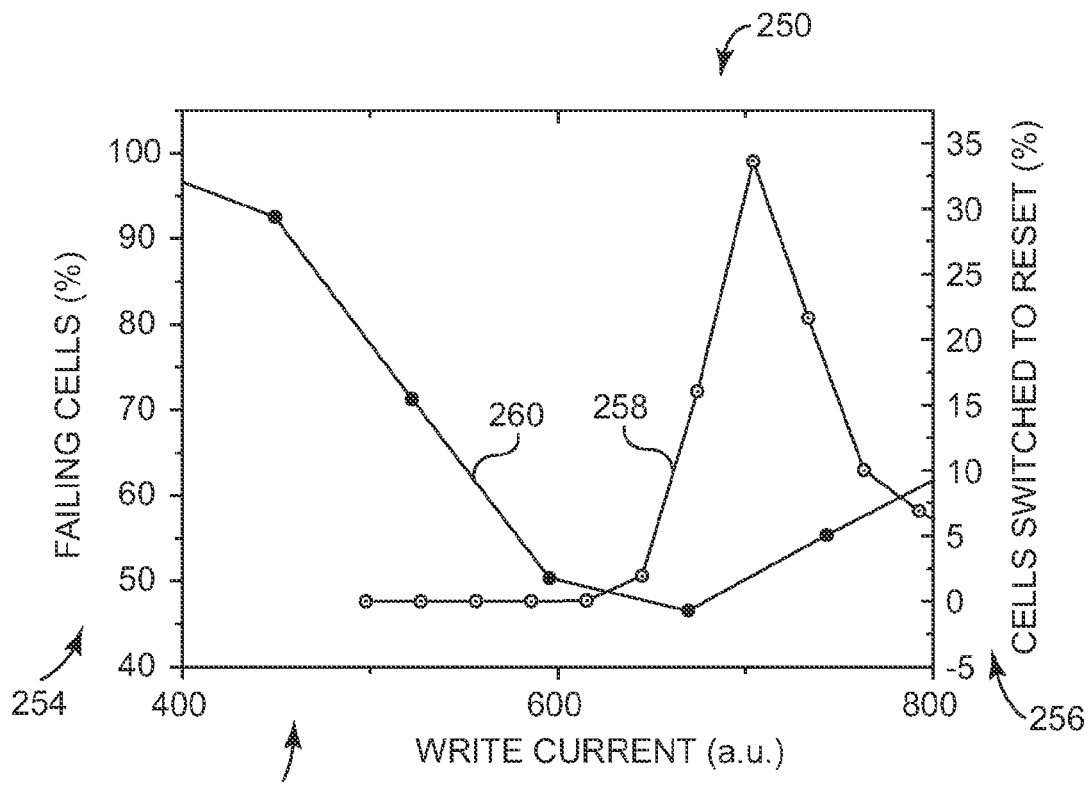
FIG. 12 is a chart illustrating one embodiment for optimizing a seed pulse amplitude.

FIG. 12 is a chart 250 illustrating one embodiment for optimizing a seed pulse amplitude. Chart 250 includes write current in arbitrary units on x-axis 252, failing cells in percentage on y-axis 254, and cells switched to reset in percentage on y-axis 256. Curve 258 indicates the percentage of memory cells reset to the amorphous state using a reset pulse having a pulse amplitude as indicated by the write current.

Curve 260 indicates the percentage of failing memory cells after applying a seed pulse followed by a set pulse to each memory cell. In this embodiment, failing memory cells are memory cells having a resistance greater than 20 kOhms. The seed pulse has a pulse width of 50 ns and the set pulse has a pulse width of 250 ns. There is a delay of 10 ns between the seed pulse and the set pulse. The amplitude of the set pulse is constant and the amplitude of the seed pulse is varied as indicated by the write current. As indicated by curve 260, the most effective seed pulse amplitude is about 670 a.u. This seed pulse amplitude is just below the onset of the reset current distribution indicated by curve 258. Therefore, the optimum seed pulse is a borderline reset pulse having a pulse amplitude just below the pulse amplitude of a reset pulse.

Figure 13:
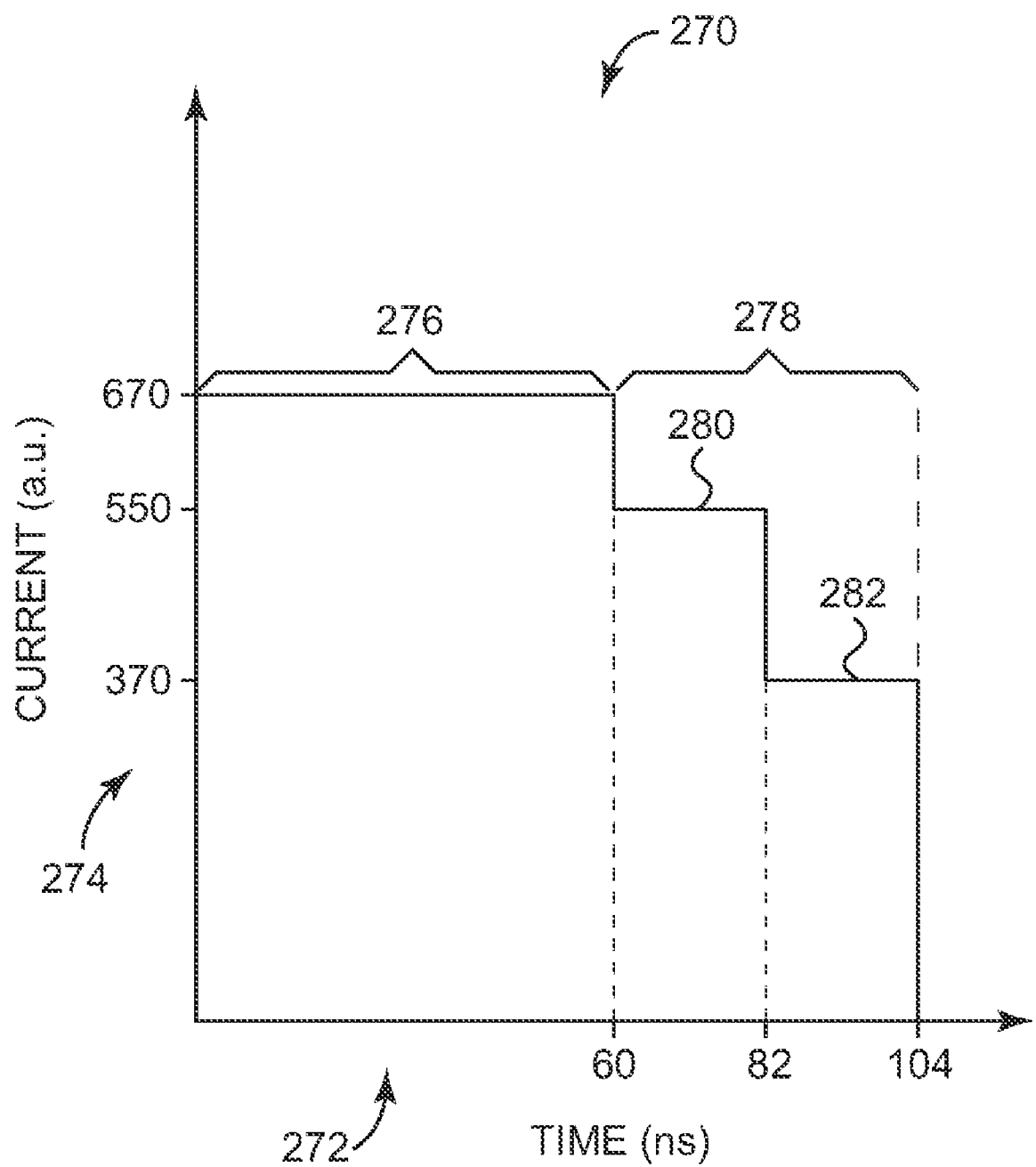
FIG. 13 is a diagram illustrating another embodiment for setting a phase change element to the crystalline state by using an optimized seed-set pulse.

FIG. 13 is a diagram illustrating another embodiment for setting a phase change element to the crystalline state by using an optimized seed-set pulse 270. Time in nanoseconds (ns) is on x-axis 272 and current in arbitrary units (a.u.) is on y-axis 274. Optimized seed-set pulse 270 includes multiple steps and has a total pulse width of 104 ns.

Optimized seed-set pulse 270 includes a seed portion 276 and a set portion 278. In this embodiment, seed portion 276 has an amplitude of 670 a.u. and a width of 60 ns. There is no delay between seed portion 276 and set portion 278. Set portion 278 includes multiple steps and has a width of 44 ns. Set portion 278 includes a first portion 280 and a second portion 282. First portion 280 has an amplitude of 550 a.u. and a width of 22 ns. Second portion 282 has an amplitude of 370 a.u. and a width of 22 ns. In other embodiments, the width of set portion 278 is increased and the amplitude of first portion 280 and/or second portion 282 is decreased. Seed portion 276 reduces the volume of amorphous phase change material of an over reset phase change element and set portion 278 programs the phase change element to the crystalline state. In other embodiments, other suitable seed-set pulse configurations are used.

Embodiments provide a method for programming a phase change element to the crystalline state. To set a phase change element to the crystalline state, a seed pulse followed by a set pulse is applied to the phase change element or a seed-set pulse is applied to the phase change element. The seed pulse or seed portion of the seed-set pulse reduces the volume of amorphous phase change material in an over reset phase change element and increases the density of nucleation sites within the amorphous phase change material. The set pulse or the set portion of the seed-set pulse then programs the phase change element to the crystalline state. The seed pulse and set pulse combination and the seed-set pulse reduce the time used to set a phase change element to the crystalline state, thereby increasing the overall speed of a phase change memory.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   a phase change element; and
   a circuit configured to program the memory element to a crystalline state from an amorphous state by applying a seed pulse to the phase change element followed by a set pulse,
   wherein the seed pulse reduces a volume of amorphous phase change material within the phase change element while increasing a density of nucleation sites within the amorphous phase change material.

2. The integrated circuit of claim 1, wherein the seed pulse comprises a borderline reset pulse.

3. The integrated circuit of claim 1, wherein the set pulse comprises one of a multi-step set pulse and a ramping tail set pulse.

4. The integrated circuit of claim 1, wherein the circuit is configured to provide a delay between the seed pulse and the set pulse.

5. A system comprising:
   a host; and
   a memory device communicatively coupled to the host, the memory device comprising:
      a phase change element; and
      a write circuit configured to program the phase change element to a crystalline state from an amorphous state by:
         reducing a volume of amorphous phase change material within the phase change element while increasing a density of nucleation sites within the amorphous phase change material; and
         transitioning the reduced volume of amorphous phase change material to the crystalline state.

6. The system of claim 5, wherein the write circuit is configured to program the phase change element to the crystalline state from the amorphous state by applying a seed pulse followed by a set pulse to the phase change element.

7. The system of claim 5, wherein the write circuit is configured to program the phase change element to the crystalline state from the amorphous state by applying a seed-set pulse to the phase change element.

8. A method for operating a memory, the method comprising:
programming a resistance changing memory element to a crystalline state from an amorphous state, the programming comprising:
applying a seed pulse to the memory element; and
applying a set pulse to the memory element following the seed pulse;
wherein programming the resistance changing memory element comprises programming a phase change element, and
wherein applying the seed pulse comprises applying the seed pulse to increase a density of nucleation sites within amorphous phase change material within the memory element.

9. The method of claim 8, wherein applying the seed pulse comprises applying a borderline reset pulse.

10. The method of claim 8, wherein applying the seed pulse comprises applying the seed pulse to reduce a volume of amorphous phase change material within the memory element.

11. The method of claim 8, wherein applying the set pulse comprises applying one of a multi-step set pulse and a ramping tail set pulse.

12. The method of claim 8, further comprising:
delaying a set time after the seed pulse before applying the set pulse.

13. A method for operating a memory, the method comprising:
programming a phase change element to a crystalline state from an amorphous state, the programming comprising:
reducing a volume of amorphous phase change material within the phase change element while increasing a density of nucleation sites within the amorphous phase change material; and
transitioning the reduced volume of amorphous phase change material to the crystalline state,
wherein transitioning the reduced volume of amorphous phase change material to the crystalline state comprises heating the reduced volume of amorphous phase change material above its crystallization temperature.

14. The method of claim 13, wherein reducing the volume of amorphous phase change material within the phase change element while increasing the density of nucleation sites within the amorphous phase change material comprises heating a portion of the amorphous phase change material to near melting.

15. An integrated circuit comprising:
a phase change memory element; and
a circuit configured to program the memory element to a crystalline state from an amorphous state by applying a seed pulse to the memory element followed by a set pulse,
wherein the memory element in the amorphous state comprises a volume of amorphous phase change material with nucleation sites within the volume of amorphous phase change material, and
wherein the seed pulse reduces the volume of amorphous phase change material within the memory element while increasing a density of the nucleation sites within the volume of amorphous phase change material.

16. The integrated circuit of claim 15, wherein the circuit is configured to provide a delay between the seed pulse and the set pulse.

\* \* \* \* \*